United States Patent [19]
Schleifstein et al.

[11] Patent Number: 5,399,432
[45] Date of Patent: Mar. 21, 1995

[54] GALVANICALLY COMPATIBLE CONDUCTIVE FILLER AND METHODS OF MAKING SAME

[75] Inventors: Robert A. Schleifstein, Edison; Andrew M. Wasowicz, West Paterson, both of N.J.

[73] Assignee: Potters Industries, Inc., Carlstadt, N.J.

[21] Appl. No.: 987,128

[22] Filed: Dec. 8, 1992

Related U.S. Application Data

[63] Continuation-in-part of Ser. No. 535,365, Jun. 8, 1990, Pat. No. 5,175,056.

[51] Int. Cl.$^6$ ............................................. B32B 5/16
[52] U.S. Cl. ................................. 428/403; 252/512; 252/513; 252/516; 252/520; 428/494; 428/469; 428/472; 428/699; 428/702
[58] Field of Search ............... 428/403, 404, 469, 472, 428/699, 702, 217, 323, 328; 252/512, 513, 516, 520; 75/232, 255, 228

[56] References Cited

U.S. PATENT DOCUMENTS

| | | | |
|---|---|---|---|
| 2,299,813 | 10/1942 | Franks | 285/139 |
| 2,477,267 | 7/1949 | Robinson | 174/35 |
| 2,771,380 | 11/1956 | Coleman et al. | 117/227 |
| 3,140,342 | 7/1964 | Ehrreich et al. | 174/35 |
| 3,202,488 | 8/1965 | Ehrreich et al. | 29/192 |
| 3,562,124 | 2/1971 | Leon et al. | 428/328 X |
| 3,583,930 | 6/1971 | Ehrreich et al. | 252/514 |
| 3,609,104 | 9/1971 | Ehrreich et al. | 252/512 |
| 3,687,724 | 8/1972 | Keith et al. | 117/230 |
| 3,837,894 | 9/1974 | Tucker, Jr. | 117/70 A |
| 3,882,507 | 5/1975 | Trimble et al. | 346/74.1 |
| 3,892,600 | 7/1975 | Smeggil et al. | 148/103 |
| 4,092,459 | 5/1978 | Deffeyes et al. | 428/403 |
| 4,119,763 | 10/1978 | Blair | 428/563 |
| 4,137,361 | 1/1979 | Deffeyes et al. | 428/328 |
| 4,218,507 | 8/1980 | Deffeyes et al. | 428/328 |
| 4,400,432 | 8/1983 | Buxbaum et al. | 428/403 |
| 4,434,541 | 3/1984 | Powers, Jr. | 29/526 R |
| 4,507,359 | 3/1985 | Powers, Jr. | 428/328 |
| 4,678,716 | 7/1987 | Tzeng | 428/551 |
| 4,711,814 | 12/1987 | Teichmann | 428/403 |
| 4,725,508 | 2/1988 | Rangaswamy et al. | 428/570 |
| 4,769,280 | 9/1988 | Powers et al. | 428/328 |
| 4,882,224 | 11/1989 | Moro et al. | 428/403 |
| 5,021,368 | 6/1991 | Hoffman et al. | 501/92 |
| 5,026,605 | 6/1991 | Kitamura et al. | 428/403 |
| 5,034,157 | 7/1991 | Merrell et al. | 252/512 |

OTHER PUBLICATIONS

Conductive Elastomer Gasket Design, EMI Shielding Engineering Handbook, Chomerics, Inc., Woburn, Mass., 25:25–26 (1985).

CRC Handbook of Chemistry and Physics, 56th Edition (Weast, Ed.), D51–D58 (1975–1976).

T. Yokoyama, Mechanofusion Treatment With Angmill And Its Potential In Industrial Application, Product Literature from the Micromeritics Laboratory of Hosokowa Micron International, Inc., Summit, N.J..

M. Alonso, Mechanism Of The Combined Coating-Mechanofusion Processing Of Powders, Powder Technology, 59:45–52 (1989).

T. Yokoyama et al., The Angmill Mechanofusion System And Its Application, KONA, No. 5, 59–68 (1987).

A New Method Of Agglomerating Heterogenous Powders, Particle Fabrication, Product Literature of Bepex Corporation, Minneapolis, Minn.

(List continued on next page.)

Primary Examiner—D. S. Nakarani
Assistant Examiner—H. Thi Lê
Attorney, Agent, or Firm—Curtis, Morris & Safford

[57] ABSTRACT

Composite particles suitable as conductive filler for electrically conductive compositions which can be used as gaskets, caulking and plastics, for example. The compositions are useful as EMI shielding and electrostatic charge dissipation materials. Methods of making and using the foregoing are also covered.

32 Claims, 5 Drawing Sheets

OTHER PUBLICATIONS

An Introduction To Powder Modification Technology, Powder and Bulk Engineering, 50–54 (Feb., 1990).

J. S. Benjamin, Mechanical Alloying, Scientific American, 234:40–48 (1976).

B. Fultz et al., Mechanical Alloying Of Fe And V Powders: Intermixing And Amorphous Phase Formation, J. Mater, Res. 4(6):1450 (1989).

Military Specification–Shielding Gasket, Electronic, Elastomer, EMI/RFI, General Specification MIL–G–83528 (Apr. 1, 1988).

Standard Method of Salt Spray (Fog) Testing, ASTM Designation:B117–85.

Product Bulletin for Information Circular No. 194 entitled Mechano Fusion, MikroPul, Hosakawa Micron International Inc., Summit, N.J..

Product Circular entitled Mechano Fusion System, MikroPul, Hosakawa Micron International Inc., Summit, New Jersey.

MIKROPUL "Mechano Fusion System".

Bulletin P.1, Process Equipment for Powder Surface Modification, Bepex Corp., Rolling Meadows, Ill.

E. J. Carlson, Less Corrosive EMI Shielding Materials for Arrow Space Applications, ITEM, 20–34 (1990).

D. M. Bigg et al., Molded Composites as EMI Shields, Industrial Research/Development, 103–105 (Jul. 1979).

H. L. El-Amin, EMI Shielding–Part II Conductive Additives, Plastics Technology, 67–72 (Aug., 1981).

GALVANICALLY COMPATIBLE CONDUCTIVE FILLER AND METHODS OF MAKING SAME

This application is a continuation-in-part of application Ser. No. 07/535,365, filed Jun. 8, 1990, now U.S. Pat. No. 5,175,056, and a continuation-in-part of international application no. PCT/US91/04014.

FIELD OF THE INVENTION

The present invention relates to conductive particles, especially conductive particles adapted to be galvanically compatible with a metal or metal alloy, i.e., galvanically compatible conductive filler. The invention also relates to new materials, e.g., gaskets, caulking compounds, adhesives, coatings, etc., which incorporate such conductive particles, i.e., the galvanically compatible filler, and which are useful for electromagnetic interference (EMI) shielding or for electrostatic charge dissipation.

Several publications are cited to describe more fully the state of the art to which this invention pertains. The publications are identified in the following text by use of Arabic numerals in parentheses. Full citations for these references, to which the textual identifications are keyed, are found immediately preceding the claims.

BACKGROUND OF THE INVENTION

Conductive materials which are, to some degree, plastic are useful in various technological applications.

For example, conductive materials can be utilized as conductive filler in relatively lightweight shielding for electronic devices. This shielding is used to protect sensitive electronic devices from relatively high levels of electromagnetic radiation in the environment resulting from the increased utilization of electronic equipment.

More specifically, while protection can be provided by metallic shields, the substantial weight of solid metal shields, as well as their relatively high cost makes their use impractical. Moreover, housings for electronic components are often constructed in two or more parts to allow for ready access to the electronic components. Metallic shields are ineffective for sealing gaps between the parts of such housings, and therefore are not suited for protecting the components within from adverse atmospheric conditions. Accordingly, it is desirable to provide an EMI shield which is relatively lightweight and sufficiently plastic to act as a sealant, to protect housed electronic components from the elements, as well as to protect the components from EMI.

The basic requisite for such EMI shielding material is that it conduct electricity. Electrical conductivity can be imparted to plastics via incorporation of conductive fillers into the plastic matrix. This would seem in principle to be an acceptable solution. However, in practice there is a significant problem.

On the one hand, typical conductive fillers contain silver, nickel or copper. On the other hand, the housings for electronic components are typically made of aluminum. Because silver, nickel and copper are more noble than aluminum, these metals will set up a galvanic cell in contact with aluminum in the presence of moisture. In other words, there is an electrochemical potential difference between aluminum and the conductive fillers. This results in accelerated corrosion of the aluminum housing, which is referred to as galvanic corrosion (1). A filler which does not give rise to galvanic corrosion is needed.

Another application for conductive filler is incorporation in plastic material to provide an electrostatic charge dissipation composition. Such a composition can be deposited on, for instance, a metal surface so that, when a person carrying a static charge touches the coated surface, the charge is bled off by the conductive material in the composition, rather than discharged in a spark. Of course, the plasticity of the material is useful in conforming it to the surface's configuration, etc. But, as will be appreciated, the same galvanic corrosion difficulties as discussed above are attendant to use of electrostatic charge dissipation compositions containing conventional conductive fillers.

Ideally, to avoid galvanic corrosion, one could make the conductive filler from the same metal as that of which the housing is composed. Thus, in the case of an aluminum housing, aluminum powder would be used as a filler. However, the use of aluminum powder is disadvantageous in that the natural oxide film on the aluminum particles prevents the passage of electricity owing to the high resistivity of the oxide.

As a solution to the foregoing difficulty, the inventors identified in U.S. application Ser. No. 535,365 filed Jun. 8, 1990 now U.S. Pat. No. 5,175,056, have disclosed composite particles and compositions containing same. The particles comprise an electrically conductive core material and an electrically conductive refractory material. The core material, for instance, aluminum, has a surface oxide formation, but this does not prevent the use of the particle in utilities requiring conductivity (i.e., relatively low resistivity) because the refractory material is conductively fused to the core material and provides access to it through the oxide layer, typically breaching the layer. This overcomes the barrier to conductivity which would otherwise be posed by the oxide layer. Of course, because surface-oxide difficulties are obviated, the skilled practitioner is provided the freedom to choose a core material which is galvanically compatible with the housing or other metallic element that the particle-filled gasket or other material will abut.

This is a substantial progress over particles used heretofore, such as over aluminum particles, since long-term resistivity is appreciably lowered, and also over silver coated aluminum particles, since galvanic corrosion—characteristic with the latter—is suppressed. However, a further improvement in long-term resistivity would be a significant advance. Moreover, the initial resistivity of the composite particle mentioned above is incongruously (albeit only temporarily) high in comparison to that of other conventional particles. This has hampered the acceptance of that composite particle in industry. A decrease in initial resistivity would also be a great boon. Additionally, the aforementioned composite particle requires a relatively considerable amount of effort to disperse in binder matrix material when fashioning a gasket or other article of manufacture. A more dispersible particle would be highly advantageous.

Other galvanically compatible particles and compositions containing same are disclosed in PCT Application PCT/US91/04014 filed Jun. 7, 1991, published Dec. 11, 1991, under the number WO 91/18740. It is believed that an improvement of the resistivity and/or dispersibility of such particles can be improved even further, and that such improvement would be a desirable advance.

OBJECTS OF THE INVENTION

It is therefore an object of the present invention to provide a composite material having improved electrical conductivity characteristics, and which is galvanically compatible with a given metal.

It is another object of the present invention to provide a material suitable for EMI shielding or electrostatic charge dissipation applications, which incorporates composite material of improved electrical conductivity as filler, and which is galvanically compatible with a given metal.

It is another object of the present invention to provide an EMI shielding material which incorporates a plurality of composite particles having improved electrical conductivity, and which is galvanically compatible with a given metal (e.g., constituting the housing for electronic components).

It is a further object of the present invention to provide an EMI shielding material which is simultaneously capable of protecting electrical components contained within a housing from adverse atmospheric conditions and of reducing substantially galvanic corrosion of the housing.

It is yet another object of the present invention to provide methods for making and using the aforementioned materials, including providing EMI shielding between two surfaces.

Various other objects, advantages and features of the invention will become readily apparent from the ensuing description.

SUMMARY OF THE INVENTION

In one aspect, the invention is a composite particle suitable for incorporation in a composition, which composition is galvanically compatible in respect of a metallic material, said particle comprising in combination (1) a core material (a) which is metallic and has an analysis substantially the same as that of said metallic material, (b) which is substantially electrochemically inert in respect of said metallic material, or (c) which includes a first portion having an analysis substantially the same as that of said metallic material and a second portion which is substantially electrochemically inert in respect of said metallic material, (2) an electrically conductive material, which electrically conductive material is substantially inert to participation in or catalysis of cathodic reaction involving the electrochemical reduction of molecular oxygen or water, and (3) interposed between said electrically conductive material and said core material, a noble metal or noble metal alloy; said electrically conductive material and said core material being bonded. In a further aspect, the invention comprises a plurality, typically a multiplicity, of such composite particles.

In another aspect, the invention is an electrically conductive composition which is galvanically compatible with a metallic material, said composition comprising in combination (a) a binder matrix; and (b) a plurality of composite particles dispersed throughout said binder matrix, each of said particles comprising in combination a core material (i) which is metallic and has an analysis substantially the same as that of said metallic material, (ii) which is substantially electrochemically inert in respect of said metallic material, or (iii) which includes a first portion having an analysis substantially the same as that of said metallic material and a second portion which is substantially electrochemically inert in respect of said metallic material; an electrically conductive material, which electrically conductive material is substantially inert to participation in or catalysis of cathodic reaction involving the electrochemical reduction of molecular oxygen or water, and interposed between said electrically conductive material and said core material, a noble metal or noble metal alloy, said electrically conductive material being bonded to said core material. Typically, the composite particles are incorporated in an amount sufficient to provide electrical conductivity; this can be derived empirically, without undue experimentation, by the skilled artisan once equipped with the teachings herein.

Yet another aspect of the invention is directed to a method for preparing a composite particle suitable for incorporation in a composition which is galvanically compatible in respect of a metallic material, which method comprises depositing a noble metal or noble metal alloy on a core material (i) which is metallic and has an analysis substantially the same as that of said metallic material, (ii) which is substantially electrochemically inert in respect of said metallic material, or (iii) which includes a first portion having an analysis substantially the same as that of said metallic material and a second portion which is substantially electrochemically inert in respect of said metallic material, contacting said core material bearing said noble metal or noble metal alloy with an electrically conductive material that is substantially inert to participation in or catalysis of cathodic reaction involving the electrochemical reduction of molecular oxygen or water, said contact being effected under conditions such that said core material and said electrically conductive material are bonded.

In still another aspect, the invention is directed to a method for preparing an electrically conductive composition, which is galvanically compatible in respect of a metallic material, which method comprises admixing a binder matrix with a plurality of composite particles so as to disperse said particles throughout said matrix, each of said composite particles comprising in combination (a) a core material (i) which is metallic and has an analysis substantially the same as that of said metallic material, (ii) which is substantially electrochemically inert in respect of said metallic material, or (iii) which includes a first portion having an analysis substantially the same as that of said metallic material and a second portion which is substantially electrochemically inert in respect of said metallic material, (b) an electrically conductive material that is substantially inert to participation in or catalysis of cathodic reaction involving the electrochemical reduction of molecular oxygen or water, and (c) interposed between said electrically conductive material and said core material, a noble metal or noble metal alloy; said core material and said electrically conductive material being bonded.

The compositions of the invention can be used as, among other things, EMI shielding, for electrostatic charge dissipation applications, and as corrosion protection materials (in the cases discussed hereinafter), and may also be useful as shielding or protection for humans against one or more various forms of electromagnetic radiation.

The incorporation, in the particles of this invention, of noble metal or noble metal alloy between the electrically conductive material and the core material results in substantial advantages. The resistivity of the particles is improved in certain embodiments, apparently due to the action of the noble metal or noble metal alloy, especially initial resistivity. Furthermore, an increase in the dispersibility of particle embodiments incorporating the noble metal or noble metal alloy component can be realized. Yet, galvanic compatibility is retained, and therefore the problem with galvanic corrosion discussed above should be minimized or eliminated. This is surprising since, for embodiments where the composite particles include a noble metal or noble metal alloy having an electrochemical potential dissimilar to that of the base metal of a housing or other structure to which a composition containing the composite particles are applied, it would be expected that galvanic compatibility would be lost and that galvanic corrosion would occur. The simultaneous achievement of low resistivity (i.e., high conductivity) and good overall galvanic compatibility is a very attractive feature of the present invention.

Various other objects, advantages and features of the invention will become readily apparent from the ensuing description of the invention, when read with reference to the accompanying figures wherein:

DESCRIPTION OF CERTAIN PREFERRED EMBODIMENTS OF THE INVENTION

Figure 1:
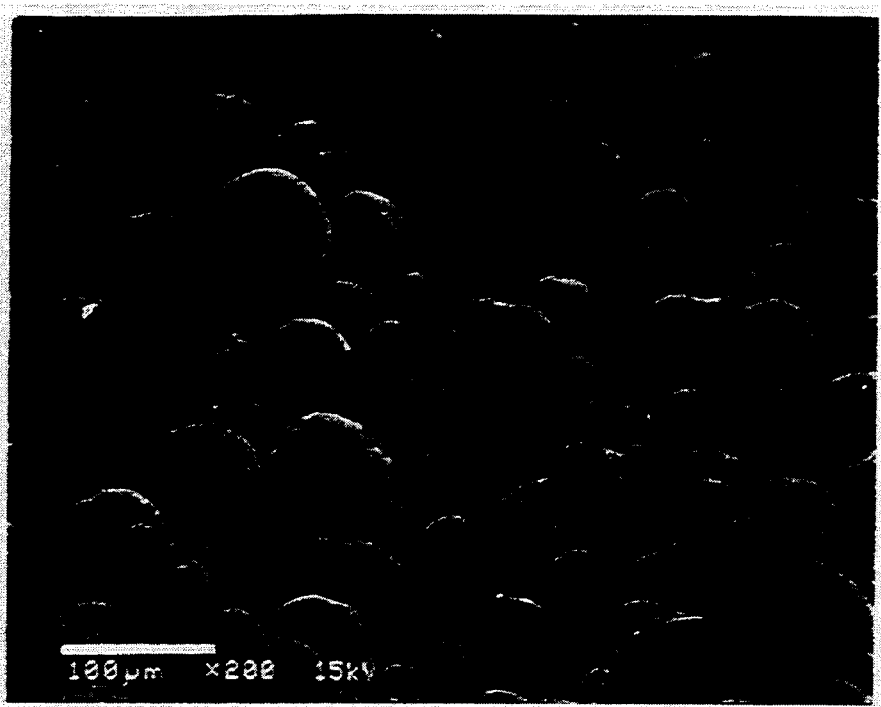
FIGS. 1 and 2 show scanning electron micrographs (SEM) of particulate core material on which silver has been deposited in accordance with the invention, but before the conductive material has been incorporated.

A central feature of the claimed invention is the incorporation of the noble metal or noble metal alloy component in the composite particle (the term "particle" as used herein refers to a small quantity of matter which can be spherical or irregular in shape; it is preferable in certain embodiments that the particles in accordance with the invention are irregular in shape). Typically, the noble metal or noble metal alloy is located on the surface of the core material (or if the core material has oxides on its surface, on top of such oxides), but under the electrically conductive material—especially electrically conductive refractory material—applied to the core material. The preferred configuration is that the noble metal or noble metal alloy, roughly, be sandwiched between the core material and the electrically conductive material. While not wishing to be bound by the following theory, and while not completely understanding the phenomenon, we believe that locating the noble metal or noble metal alloy under the electrically conductive material has the effect of "shielding" the noble metal or noble metal alloy from the base metal housing or other structure to which a composition containing particles of the invention may be applied, thus preventing the establishment of a galvanic cell and preventing galvanic corrosion. (It should be noted that when silver is not interposed between the electroconductive material and the core material, but rather applied over the electroconductive material, results appear to be substantially deteriorated.) Hence, it is preferred to cover as much of the noble metal or noble metal alloy as possible with the electrically conductive material.

Typically, the noble metal utilized is silver or gold, but other noble metals (for instance, platinum or palladium) can be used. Also, noble metal alloys, such as alloys of two or more noble metals, or alloys of one or more noble metals with one or more other metals can be utilized. Examples of the alloys include alloys of noble metals which have comparable resistivities to the noble metals themselves. (One of ordinary skill in the art, once equipped with the teachings herein, will be able to formulate and utilize such alloys, for example, alloys of silver with other noble metals or other conductive metals, without undue experimentation.) The noble metal or noble metal alloy is incorporated in the composite particles of the invention in an amount sufficient to effect a decrease in resistivity of those particles, and compositions in which they are utilized, but not in such great amount that the suppression of galvanic corrosion with the invention is compromised, or the cost-benefits of utilizing a decreased amount of noble metal or noble metal alloy (vis-a-vis typical conventional embodiments) are lost or appreciably diluted. Preferably, the noble metal or noble metal alloy is incorporated in the composite particle in an amount of from 2-8 weight percent, more preferably 2-5 weight percent, especially 3 weight percent. However, it will be appreciated that one of ordinary skill in the art, equipped with the teachings herein, can determine the amount of noble metal or noble metal alloy to be incorporated in the composite particle of the invention so that it is suitable for his purpose without undue experimentation.

The amount of noble metal or noble metal alloy which is incorporated influences the form which the noble metal or noble metal alloy takes on the core material. Typically, because only a relatively small amount of noble metal or noble metal alloy is utilized, there is not enough of it to completely coat or cover the surface of the core material. Rather, the noble metal or noble metal alloy is in discrete formations on the surface of the core materials, those formations ordinarily being themselves each composed of a multiplicity of minute noble metal or noble metal alloy particles. The formations of the noble metal or noble metal alloy are of varying size and thickness, depending on the amount of noble metal or noble metal alloy used and the size of the core material bodies on which the noble metal or noble metal alloy is deposited. Thus, for a given core material body size, the more noble metal or noble metal alloy used, the larger and/or thicker will be the noble metal or noble metal alloy deposits. Correspondingly, for a given amount of noble metal or noble metal alloy, the smaller the core material bodies and therefore the greater the core material surface area, the smaller and/or thinner will be the noble metal or noble metal alloy formations.

Figure 2:

Illustrative of the noble metal or noble metal alloy formations on core material as discussed above, are the particles depicted in FIGS. 1 and 2. FIG. 1 shows aluminum particles, on which silver has been deposited, at a magnification of 200 times. The larger (core) particles are aluminum, and the smaller particles which appear on the surfaces of the larger particles are silver formations. In FIG. 2, at a magnification of 1000 times, the silver formations can be seen more clearly. They appear as small deposits which adhere to, and break the contour of, the surfaces of the larger particles. As is plain, the silver formations do not completely cover the surface area of the aluminum particles.

In certain highly preferred embodiments of the invention, the noble metal or noble metal alloy is applied to metallic core materials.

Advantageously, the metal of the core material can be aluminum, tin, zinc, nickel, cadmium or magnesium. Other metals can be used, as well as metal alloys (such as tin/antimony alloy), so long as these metals or metal alloys are electrically conductive. Optimum galvanic compatibility can be achieved by using a core material of the same metal or metal alloy as that of the substrate which is sought to be protected.

However, in the invention's broader aspects, the core material of a composite particle is selected to be galvanically compatible with a given metallic material, such as a surface or the like, and is not necessarily a metal. The core material can be chosen from a wide range of alternatives, depending upon which one accommodates the contemplated application. Thus, the core material can (a) have an analysis which is substantially the same as that of a metallic material with which an electrically conductive composition containing the core material would come in contact during use, (b) be substantially electrochemically inert in respect of the metallic material, or (c) comprise a combination of a first portion having an analysis substantially the same as that of the aforementioned metallic material and a second portion which is substantially electrochemically inert in respect of the metallic material.

The term "metallic" as used herein refers to a material which includes in substantial part one or more metals. It encompasses a material which is made up of a single metal, or more than one metal (in alloy form or otherwise), or a material which contains both one or more metals and one or more other nonmetallic components in the form of one or more compounds, or in the form of a composition.

When the core material is metallic it is electrically conductive. The term "electrically conductive" as used herein refers to a material which obeys Ohm's law and therefore is capable of conducting electricity. In certain embodiments, an electrically conductive core material in accordance with the invention advantageously has a resistivity of less than about $15 \times 10^{-6}$ ohm-cm at 0° C., more advantageously below about $10 \times 10^{-6}$ ohm-cm.

As previously indicated, the analysis of a metal or metal alloy selected for the core material is advantageously substantially the same as the analysis of the metallic material which is sought to be protected against galvanic corrosion. For purposes of this invention, the respective metallic analyses are considered substantially the same when the core material contains the same metal(s) as the metallic material, or equivalent metal(s), in an amount or amounts sufficiently similar such that there is no appreciable electrochemical potential difference between the core material and the metallic material. In certain other embodiments the core material is a conductive metal or metal alloy which is more anodic than the metallic material, that is, the metal of the substrate (e.g., the metal of the housing), sought to be protected. The core material can be selected from various suitable metals or metal alloys, the specific choice in each case depending upon the metal of the substrate to be protected.

Metallic core materials are advantageously in particulate form. In some embodiments the particles are substantially spheroidal, for instance spherical, but in other embodiments are irregular. The core material particles can also be a combination of any two or more configurations as aforesaid.

In other embodiments, the core material comprises one or more substances which is substantially electrochemically inert in respect of the metallic material which is sought to be protected. That is, the core material is one or more substances incapable of entering into an appreciable electrochemical interaction with the metallic material sought to be protected. Since there is no appreciable electrochemical interaction, the core material does not, practically speaking, contribute to galvanic corrosion. Suitable core materials of this type are glasses, such as soda lime glass or borosilicate glass, as well as ceramic substances such as alumina, and mica and other minerals. This type of core material is also advantageously in particulate form. The particles can be substantially spheroidal (such as spherical), either solid or hollow (for example, hollow microspheres), but can alternatively be irregular, or in the form of fibers, strands or the like. Additionally, these particles can be a combination of any two or more of the foregoing configurations.

In still other embodiments of the invention, the core material is a composite; there is a component having an analysis substantially the same as that of the metallic material sought to be protected, and another component which is substantially electrochemically inert in respect of the metallic material sought to protected against galvanic corrosion. As in the preceding two cases, each of these components is typically selected so as to eliminate or minimize galvanic corrosion. Typical combinations are a metallic portion and an inert portion which are compatible with one another, joined in a composite particulate material configured as described heretofore. For instance, the core material can be a galvanically compatible metal or metal alloy coated on an inert particulate substrate, such as tin coated on glass fiber segments or aluminum coated on hollow glass microspheres.

It is noteworthy that metallic core materials of the type discussed above, especially materials such as aluminum, often have a naturally occurring surface oxide formation. As indicated heretofore, such oxide formation (which typically appears as a film or coating on particles of the core material) can increase the resistivity of the core particle to such an extent that it is unsuitable for use as a conductive filler. It will be apparent from the following that the present invention can be adapted for use with the core materials that have a surface oxide layer or other oxide formation. Alternatively, in certain embodiments of the invention, the core materials are substantially free of surface oxide formation (as a result of the prevention of oxide formation and/or the removal of such oxides).

The other component of the composite particles of the invention is an electrically conductive material which is also galvanically compatible with the metallic material sought to be protected against galvanic corrosion. In certain preferred embodiments of the invention, the electrically conductive material is a refractory material. The term "refractory material" as used herein refers to a chemical compound which is capable of conducting electricity and which is slow to melt and which resists the action of heat; these compounds have high melting temperatures and are stable over a wide range of temperature. Embodiments of the invention directed to refractory materials are usually well-suited for use with oxide-bearing core materials, for reasons set forth below.

Refractory materials in accordance with the invention can typically be selected from a variety of refractory materials well known in the art (2). The refractory material in accordance with the invention can be a single refractory material or a combination of two or more refractory materials. In certain advantageous embodiments, the refractory material has a hardness which is greater than the hardness of the core material. In certain other advantageous embodiments, such as where the oxide layer of the core material is particularly thick, the refractory material can be harder than the oxide layer. Typically, the hardness of the core material is on the order of about 1 to 6 Mohs and the hardness of the refractory material is on the order of about 3 to 10 Mohs. Advantageously, the refractory material has a resistivity less than 1 ohm-cm.

Preferred refractory materials include metal carbides, metal silicides, metal nitrides and metal oxides. Typical suitable metal carbides are tungsten carbide, niobium carbide, titanium carbide, vanadium carbide, molybdenum carbide, zirconium carbide and boron carbide. Typical suitable metal sulfides are copper sulfide, silver sulfide, iron sulfide, nickel sulfide, cobalt sulfide, lead sulfide and zinc sulfide. Typical suitable metal silicides are chromium silicide, molybdenum silicide, cobalt silicide, vanadium silicide, tungsten silicide and titanium silicide. Typical metal borides are chromium boride, molybdenum boride, titanium boride, zirconium boride, niobium boride and tantalum boride. Typical metal nitrides are tantalum nitride, titanium nitride, vanadium nitride and zirconium nitride. Typical suitable metal oxides are tin oxide, iron oxide, manganese oxide, copper oxide, lead oxide, ruthenium oxide, chromium oxide, silver oxide and antimony oxide. $WC$, $W_2C$, $NbB$, $NbB_2$, $TiN$, $VSi_2$, $MoB$, $TiB_2$, $ZrB_2$, $B_4C$, $ZrN$, $CoSi_2$ and $MoSi_2$ are especially preferred.

In certain advantageous embodiments, the core material and the refractory material are conductively fused by configuring the particle such that the refractory material provides a conductive path through the oxide layer of the core material to the core material itself. Typically, the refractory material breaches the oxide layer so as to make contact with the core material (either directly or through noble metal or noble metal alloy remaining between the refractory material and the core material) and extend outwardly from the oxide layer. Thus, an electrical current can be conducted through the oxide layer to the core material via the refractory material.

Figure 3:
FIG. 3 shows a scanning electron micrograph (SEM) of tungsten carbide particles suitable for use in practicing the invention.

FIG. 3 illustrates a typical electrically conductive refractory material suitable for practicing the invention, namely, tungsten carbide (WC). As can be seen, the carbide particles are irregular, and have pronounced projections which are useful for breaching surface oxide deposits on core material and indenting or embedding in the core material.

However, the electrically conductive materials suitable for use in the invention are not limited to refractory materials. Rather, more broadly, the invention can be practiced with electrically conductive materials which have the following properties in combination:

(1) The material has sufficiently high electrical conductivity such that it is useful for the contemplated application, such as EMI shielding or electrostatic charge dissipation.

(2) The electroconductive material should be substantially inert to participation in, and to catalysis of, cathodic reaction involving the electrochemical reduction of molecular oxygen or water. Accordingly, the material's presence should not lead to any appreciable reduction as aforesaid, thereby eliminating a possible source of galvanic corrosion. This property of the electrically conductive material is essential to achievement of galvanic compatibility between the composite particle of the invention and a given metallic material.

(3) The electrically conductive material is bonded to the core material. This means that, when joined in a composite particle in accordance with the invention, the two materials do not de-bond or separate during fabrication and utilization of a composition containing the composite particle. Of course, the concept of "bonding" contemplates that the bonded materials are joined to one another directly. But, it also contemplates that the bonded materials are joined to each other by or through one or more other materials. For instance, a surface oxide formation which is integral with the core material can provide a bridge between the core material and the electrically conductive material which is anchored in or otherwise joined to the oxide. Likewise, a noble metal or noble metal alloy formation between the core material and electrically conductive material can join the latter two such that they are bonded. In certain advantageous embodiments, the particles can be "conductively bonded" i.e., not only are they bonded as discussed above, but further the core material is metallic or contains a metallic component and the electrically conductive material is in effective electrical contact with the core material so that electrons can pass back and forth between the two (whether or not they are in actual physical contact). And, as previously indicated, in certain more specific embodiments the electrically conductive material is conductively fused with the core material. The term "conductively fused" as used herein refers to a condition in which the electrically conductive material, for instance a refractory material, is integral with the core material and/or with a surface oxide layer, such that the material is in contact with or sufficiently proximate the core material that electrons can pass back and forth between the two. The state of being conductively fused includes embodiments in which the electrically conductive material (e.g., refractory material) is separated from the core material by some amount of surface oxide layer, or noble metal or noble metal alloy, as long as the interposed oxide or other material does not prevent substantial passage of electrons.

Regarding item (3) immediately preceding, in certain advantageous embodiments the electrically conductive material is present in such form and amount that any electrically insulating oxides (i.e., oxides which would have the tendency to interfere with or resist the flow of electrons) present do not substantially impair (i.e., render unsuitable for the contemplated application) the conductivity between the core material and the electrically conductive material, or between adjacent composite particles when they are incorporated in a composition in accordance with the invention. These embodiments as aforesaid include ones in which—along with the electrically conductive material—there are some insulating oxides on the core material, for instance occupying discontinuities in the electrically conductive material's coverage of the core material's surface, but the overall conductivity between adjacent composite particles in use is not substantially impaired. (Per the preceding discussion, in some embodiments, the core material has a surface oxide layer. As will be appreciated, certain of the aforementioned metals and alloys typically form oxides when in contact with ambient atmosphere, and thus naturally carry an oxide coating. For example, in the case where the core material is aluminum, the oxide layer is $Al_2O_3$ (e.g., hydrated aluminum oxides, or aluminum oxides which are not hydrated, or some combination thereof).)

The electrically conductive material can be in the form of a coating on the particulate core material. The coating can be substantially continuous over the surface of a particulate core material (this includes without limitation the embodiments in which the electrically conductive material is continuous over the entire surface of the particulate core material), but in certain other embodiments the coating is discontinuous, with the proviso that the coating covers sufficient portions of the core material particles and is of sufficient thickness that conductivity between adjacent composite particles in the composition is not substantially impaired by the aforementioned electrically insulating oxides. Alternatively, the electrically conductive material can be a particulate material with which the surface of the core material is studded (for example, in composite particles where the electrically conductive material is WC, or some other similar refractory material). In this case, the particles of electrically conductive material protrude from the core material to provide contact points at which adjacent composite particles can touch, or at least approach one another with sufficient proximity, that electrons can flow between adjacent composite particles to provide electrical conductivity without substantial impairment resulting from the formation of any electrically insulating oxides on the core material.

The electrically conductive material is typically metallic, but it can be another suitably conductive substance such as glassy or vitreous carbon. For example, it can typically be a metal or metal alloy. In some of these embodiments the material can be selected from the group consisting of tin, aluminum, zinc, nickel, and cadmium. For other embodiments, when using certain metallic substrates, gold and indium can be used with selected core materials as long as the requirements of the invention as aforesaid are satisfied. In still other embodiments the electrically conductive material is a refractory compound as previously discussed or another metal-containing compound, such as a metal carbide, metal sulfide, metal silicide, metal boride, metal nitride or metal oxide, or a combination of two or more of such compounds.

Alternatively, the electrically conductive material can be a conductive polymer. Polymers of this type are typically polyacetylene, poly (p-phenylene), poly (p-phenylene chalcogenides), polypyrrole, polythiophenes, polyaniline, and polyquinolines, though others (such as polymers with aromatic or heteroaromatic units and conjugated aliphatic units) can also be suitable in various embodiments as long as the requirements previously set forth for the electrically conductive material are satisfied. The polymers can be doped appropriately with materials which confer or enhance conductivity, such as lithium (e.g., $Li^+PF_6^-$), arsenic (e.g., $A_5F_5$), molybdenum (e.g., $MoCl_5$, $MoCl_4$), antimony (e.g., $SbF_5$), fluorosulfuric acid and the like. Such polymers and dopants are known to those of ordinary skill in the art from the literature (see, for instance, Handbook of Conducting Polymers, Vols. 1 and 2, Skotheim (Ed.), Published by Marcel Dekker, Inc., New York (1986)).

As previously discussed, in the composite particles according to the invention, the noble metal or noble metal alloy is preferably present in an amount of from 2–8 weight percent of the composite particle, preferably 2–5 weight percent, especially 3 weight percent. The core material is preferably present in an amount of about 10 to 97.5 weight percent, more preferably about 30 to 93 weight percent, especially about 60 to 88 weight percent, and the electrically conductive material, for instance, refractory material, is preferably present in an amount of about 88 to 0.5 weight percent, more preferably about 68 to 5 weight percent, especially about 38 to 10 weight percent. Of course, the smaller in size the particles are, the greater their surface area for a given weight of particles. Smaller core particles of greater surface area require a larger amount of conductive material than larger core particles of lesser surface area to achieve the same thickness of conductive material on the core particle. Thus, it will be appreciated that once equipped with the teachings herein, one of ordinary skill in the art can vary the relative amounts of core material and electrically conductive material without undue experimentation to accommodate the size of the core material particles selected and the end-use application envisioned.

Advantageously, the core material is a particle of size about 0.5 to 200 microns in average dimension, preferably about 10 to 90 microns, more preferably about 20 to 45 microns. In those embodiments where the core material has a continuous or discontinuous oxide layer, this layer has an average thickness of about 2 to 10,000 angstroms, preferably about 3 to 500 angstroms, more preferably about 5 to 100 angstroms and still more preferably about 5 to 15 angstroms. The electrically conductive material, when in the form of a coating (whether substantially continuous or discontinuous), is typically of thickness from 50 to 200,000 angstroms. When the electrically conductive material, for instance a refractory material, is a particle it is preferably of size about 0.005 to 20 microns in average dimension, more preferably about 0.05 to 5 microns, especially about 0.1 to 1 micron. In certain advantageous embodiments, the particles of the electrically conductive material, especially the refractory material, are of size ranging from about twice the thickness of any oxide layer of the core particle to about one tenth the size of the core particle.

Figure 4:
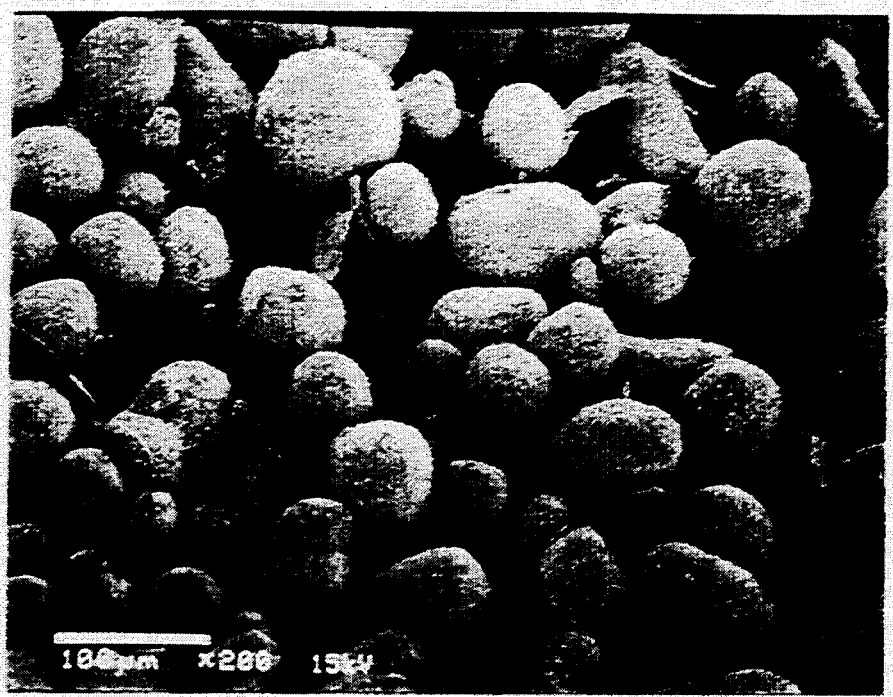
FIGS. 4 and 5 show scanning electron micrographs (SEM) of composite particles according to the invention.
Figure 5:
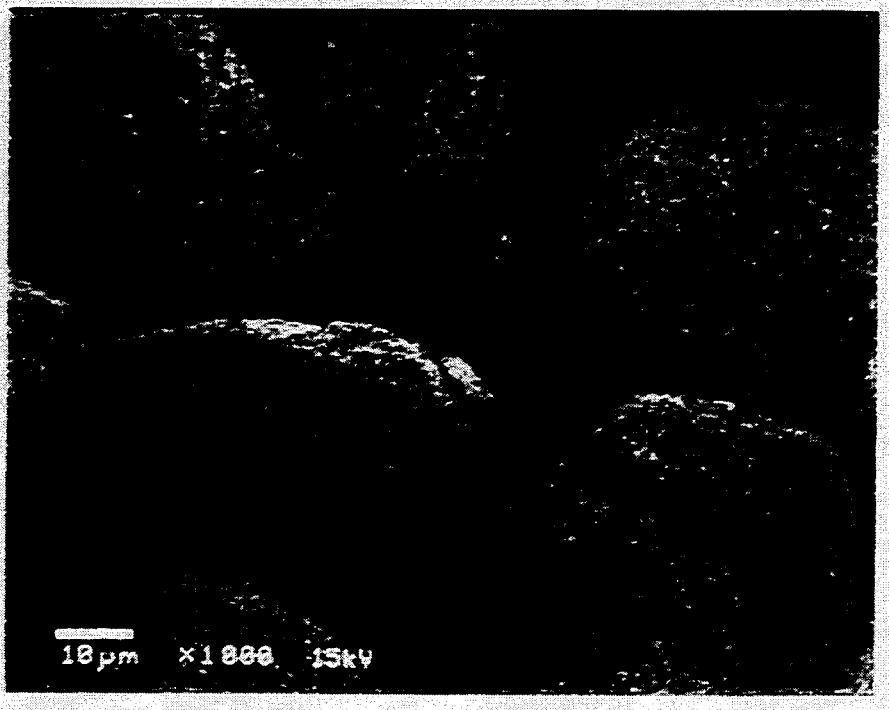

A composite particle in which the core material is aluminum with a typical surface oxide coating, the noble metal is silver and the electrically conductive material is WC, is highly preferred in accordance with the invention. Such particle in which the aluminum is 70–80 weight percent of the composite particle, silver from 2–5 (especially 3) weight percent, and WC from 15–28 weight percent is advantageous. (When the silver content is calculated based on the weight of the core material alone, the especially preferred silver content is 4 weight percent.) An example of a composite particle formed of these components is illustrated in FIGS. 4 and 5. FIG. 4 shows such composite particles, having 3 weight percent silver, at a magnification of 200 times, and FIG. 5 shows such particles at a magnification of 1000 times. As is apparent from both, the carbide covers the surface of the aluminum particles, and also the silver formations, substantially completely. Other preferred composite particles include the following (the electrically conductive material, for instance refractory material, is listed first with the core material following the slash): In/Al; Au/Al; phosphate or chromated chemical conversion coating/Al; CoSi$_2$/Al; mixed conductive oxides of Sn and Sb/Sn—Sb alloy; WC/Al; TiN/Al; VSi$_2$/Al; NbB/Al; WC/Sn; and NbB/Sn.

The composite particle of the invention is suitably prepared by a number of different methods.

Deposition of noble metal or noble metal alloy on core materials can be carried out in any suitable manner, and there are several conventional alternatives for doing this. As an illustration, they can be applied by fluidization using dry or wet methods, by electroless plating, by electrolytic plating, by vapor deposition, by wet chemical conversion, and the like. Suitable examples of such electroless plating are disclosed in U.S. Pat. No. 3,635,824 issued Jan. 18, 1972, to Raymond G. Brandes et al. See, also, U.S. Pat. No. 3,235,392 granted Feb. 15, 1966, to John Joseph Miles.

In addition, the noble metal or noble metal alloy can be applied by immersion plating, especially the following particularly advantageous technique. For example, a measured quantity of core material particles having an average particle size of, say, 25 microns, is placed in a glass round bottom flask. The particles are thoroughly cleaned through the use of a suitable detergent solution, are rinsed with deionized water, and are then immersed in a hydrochloric acid solution while undergoing agitation. The particles are again rinsed with deionized water which has been purged with nitrogen, and this latter rinsing procedure is repeated two or three times to insure that any oxidation is maintained at a minimum.

After the excess water is decanted from the thus cleaned particles, a heated noble metal or noble metal alloy solution is introduced into the flask during vigorous agitation. The solution is maintained at an elevated temperature within the range of from about 65° C. to about 95° C.

The particles are agitated in the flask for a period of time sufficient to apply the noble metal or noble metal alloy to each of the particles. The agitation is continued for, say, ten to fifteen minutes, and the excess solution is then decanted. The particles are then rinsed and thoroughly dried.

In those certain advantageous embodiments wherein the composite particle comprises in combination an electrically conductive core material, having a surface oxide layer, an electrically conductive refractory material, and the noble metal or noble metal alloy interposed therebetween, the method of production further comprises contacting (a) an electrically conductive core material having a surface oxide layer and bearing the noble metal or noble metal alloy with (b) an electrically conductive refractory material under conditions such that the core material and the refractory material are bonded, preferably conductively bonded, especially conductively fused. Additionally, in another advantageous embodiment, the method is carried out such that the refractory material is caused to provide a conductive path through the oxide layer to the core material, typically breaching the oxide layer with the refractory material indented or embedded in the electrically conductive core material.

Composite particles incorporating refractory materials according to the invention can be prepared—i.e., the contacting step can be effected—by "Mechanofusion", hybridization and/or mechanical alloying (these may be used for making other inventive composite particle embodiments also, as appropriate in the judgement of one of ordinary skill in the art). The term "Mechanofusion" (this term is a trademark of Hosokawa Micron International) as used herein refers to a process whereby materials with new properties are created by imparting extreme forms of mechanical energy to two or more kinds of materials under a controlled condition, thereby causing a mechanochemical reaction on the surfaces of such materials being processed. The Mechanofusion process is well known in the art (3,4,5). The term "hybridization" as used herein, refers to a method of modifying particle structure and surfaces by embedding or dry filming a fine particle onto the surface of a core particle. The hybridization process is also well known in the art (6,7). Like mechanofusion and hybridization, mechanical alloying, especially ball milling, is well known in the art (8,9).

Various other methods are useful in certain other embodiments of the invention.

One method by which the electrically conductive material can be incorporated in the composite particle of the invention is vapor deposition. In this method a thin coating of the electrically conductive material is formed on the core material after the noble metal or noble metal alloy has been deposited on the core material. While in some embodiments the coating can be deposited by condensation of metal vapor originating from molten metal, high voltage discharge between electrodes, evaporation, ion discharge or sputtering (such as sputtering of titanium in a nitrogen atmosphere to form titanium nitride), chemical vapor deposition is the preferred mode of operation. Examples of such preferred modes are deposition via hydrogen reduction or thermal decomposition (gas plating) of volatile metal halides, and thermal decomposition of mixtures of volatile organic compounds of metals with compounds of silicon, carbon, boron or nitrogen which deposit in combination metal silicides, carbides, borides or nitrides. Once in possession of the teachings herein, one of ordinary skill can apply such vapor deposition techniques along conventional lines to practice the invention. Examples of composite particles produced by vapor deposition are aluminum particles coated with tungsten carbide and aluminum particles coated with cobalt silicide, the aluminum core particles being substantially oxide-free as a result of having been produced by atomization, and stored in an inert atmosphere.

As discussed above, for the vapor deposition embodiments, as well as other embodiments in which the suppression of oxide formation on the core material particles is also a high priority, an especially suitable technique for producing the core particles is atomization of molten core material (particularly metallic core material), preferably under protective conditions such that the particles are substantially oxide-free. After production of such particles they are typically stored under conditions which protect against any appreciable oxidation until use. Measures which afford protection against oxide-formation are, in and of themselves, well known in the art, involving for instance the utilization of an inert (e.g., nitrogen) or reducing (e.g., hydrogen) atmosphere during atomization and/or storage.

The conductive polymers described heretofore can also be applied to the core material (bearing noble metal or noble metal alloy) as a coating to form a composite particle in accordance with the invention, provided that the core material selected is compatible with (e.g., not oxidized by) the polymers. An example of such an inert core material is a glass. This is suitably achieved by application of well known solvent coating or film forming techniques, the utilization of which will be understood by those of ordinary skill in the art once in possession of the subject matter hereof.

Yet another method by which the electrically conductive material is suitably incorporated in the composite particle of the invention is wet chemical conversion. Such coatings are formed, for example, by chromating or phosphatizing on the core material (bearing noble metal or noble metal alloy) in particulate form. This method typically does not require use of an oxide-free core because the reagents used chemically etch the oxide during the reaction. In some embodiments, the electrical conductivity of coatings formed by wet chemical conversion can be enhanced by doping such coatings with, for instance, gold or a semiconductive metal oxide as heretofore discussed through the inclusion in the reaction mixture of one or more suitable chemical agents.

Still another method which can be utilized for incorporating the electrically conductive material in the composite particle of the invention is deposition of a sol gel containing the electrically conductive material (e.g., by spraying or immersion) on core material particles (which bear the noble metal or noble metal alloy), and then causing the gel to coalesce under suitable (conventional) conditions. This method would typically be used to deposit semiconductive materials such as oxides (e.g., tin oxide, optionally doped with antimony) on the core material.

A further method for incorporating the electrically conductive material in the composite particle of the invention is electrolytic or electroless plating. Electrolytic plating involves deposition from solution of the electrically conductive material on the core material (which bears the noble metal or nobel metal alloy), acting as cathode, as a result of passage of an externally provided electric current through the solution. Electroless plating is a chemical reduction process somewhat similar to electrolytic plating except that externally provided current is not needed. The electrically conductive material deposits, from solution, on the core material substrate (already bearing the noble metal or noble metal alloy) as a result of reduction of ions of the electrically conductive material by one or more chemical reducing agents in the solution or by direct immersion-displacement plating or metallic cores with metals more noble than the core. Electrolytic plating is utilized generally with metal or metal alloy core materials, while electroless plating can be utilized with any of the core materials suitable for practice of the invention, including ones which are not metals or metal alloys. As will be appreciated, in both electrolytic and electroless plating the electrically conductive material is a metal, or a metal alloy or a metal or metal alloy treated chemically to convert it at least partially into a semiconductive compound (e.g., an oxide, sulfide, nitride, or silicide).

Accordingly, the composite particles of the present invention can be readily made by those skilled in the art.

As noted above, the invention also resides in a composition which comprises in combination a binder matrix and a plurality of composite particles, as described herein, dispersed throughout the matrix. The amount of composite particles included is, in each case, an amount which will be sufficient to achieve the desired shielding or dissipation effect, and can be derived empirically by one of ordinary skill in the art without undue experimentation once provided with the teachings herein. The material can take the form of a gasket, caulk, adhesive, coating, etc. In certain advantageous embodiments the composition is used as an EMI shielding material or an electrostatic charge dissipation material.

Figure 6:
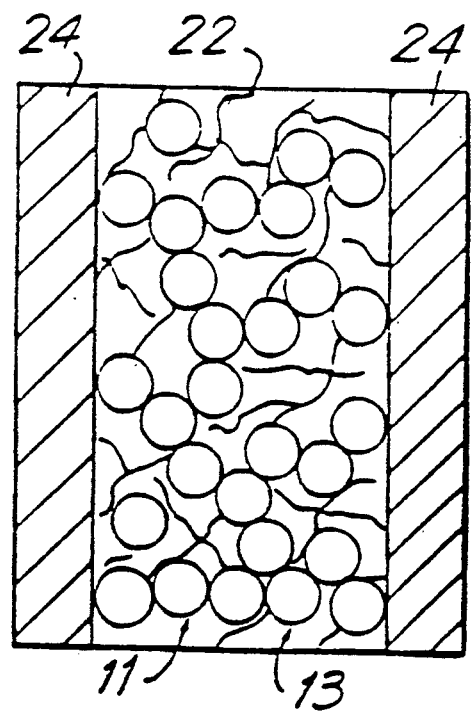
FIG. 6 is a schematic representation of a gasket material according to the invention.

FIG. 6 is a schematic representation of a gasket material 22 sandwiched between metal plates 24. Gasket material 22, an EMI shielding material, is filled with a plurality of composite particles 11. Conductive particles 11 are networked in such a way as to provide a conductive pathway for electrical current. Alternatively, another embodiment would be an EMI shielding or electrostatic charge dissipation coating, shown at 22, on right-hand plate 24 which is a surface of, for example, an equipment housing (the left-hand plate is disregarded in this case).

In another aspect, the invention is a composition as described above, comprising in combination a binder matrix and a plurality of composite particles dispersed throughout the matrix, the particles comprising in combination an electrically conductive core material, having a surface oxide layer, an electrically conductive refractory material, and interposed therebetween a noble metal or noble metal alloy, the core material and the refractory material being bonded, preferably conductively bonded, and especially conductively fused. In a particularly preferred embodiment each particle is configured such that the refractory material breaches the oxide layer and extends outwardly from the oxide layer.

Yet another aspect of the invention is directed to the aforementioned composition adapted to function as EMI shielding material or an electrostatic charge dissipation material. Correspondingly, the invention further is in a method of providing EMI shielding or electrostatic charge dissipation at a selected surface which comprises locating an EMI shielding material or electrostatic charge dissipation material adjacent said surface, said material comprising in combination a binder matrix and a plurality of composite particles as heretofore described dispersed throughout the matrix. In an advantageous embodiment, the particles comprise in combination an electrically conductive core material having a surface oxide layer, an electrically conductive refractory material, and interposed therebetween a noble metal or noble metal alloy, the core material and the refractory material being bonded, preferably conductively bonded, and especially conductively fused.

In still another aspect, the invention is directed to a method for preparing a composition as aforesaid, which comprises admixing a binder matrix with a plurality of composite particles so as to disperse the particles throughout the matrix. Each of the composite particles is as described heretofore. In one more specific embodiment the particles comprise in combination an electrically conductive core material having a surface oxide layer, an electrically conductive refractory material, and interposed therebetween a noble metal or noble metal alloy, the core material and the refractory material being bonded, preferably conductively bonded, and especially conductively fused.

In yet another embodiment, the invention is a corrosion protection material. This material comprises (a) a matrix and (b) a plurality of composite particles in accordance with the invention dispersed throughout said matrix. In several good embodiments each of said particles comprises in combination an electrically conductive core material having a surface oxide layer, an electrically conductive refractory material, and interposed therebetween a noble metal or noble metal alloy, said core material and said refractory material being bonded, preferably conductively bonded, and especially conductively fused. The material is produced by admixing composite particles of the invention with a binder material, said particles being incorporated in an amount sufficient to provide electrical conductivity; this can be derived empirically, without undue experimentation, by the skilled artisan once equipped with the teachings herein. The resulting composition is applied to a metal surface and serves to protect the metal surface from corrosion. The composition (a gasket, caulk (e.g., a sealing caulk), coating or adhesive) would serve as a sacrificial anode for the metal surface. The composition, e.g., a gasket, is deteriorated to a certain extent at which point it can be replaced with a new gasket and the protection can be continued. This material functions not only as an EMI shield and an environmental shield but also as a sacrificial anode. Thus, this material would protect the contacted base metal surface from further corrosion.

Various binder materials, both organic and inorganic, can be used for the compositions and other materials described herein, the choice of a particular binder being dependent upon the characteristics which are desired for the composition, e.g., shielding, dissipation or corrosion protection material, in each particular case. For example, the binder can include various synthetic resins, such as epoxies, chlorinated rubber, polystyrene, polyvinyl butyryl resins, polyvinyl acetate resins, silicones, and the like. Inorganic binders can also be used, including binders obtained from silicates, such as alkali metal silicates and sodium silicates, phosphates, hydrolyzed ethyl silicates, butyl-titanates, etc. The use of these and other similar binding materials will be apparent to those skilled in the art so that the particular binder suitable in each case can be selected for use in the composition, e.g., shielding, dissipation or corrosion protection material, according to the invention. Advantageously, the binder is present in the shielding material in an amount of about 20 to 80% by weight, the balance being the composite particles described above. Depending upon the particular binder used, the shielding material can also contain suitable solvents, curing agents, catalysts, plasticizers and the like, all known in the art. The specific amounts of these components, as well as the types used, will depend in each case upon the particular binder as well as the characteristics desired for the particular composition, such as shielding, dissipation or corrosion protection material, and its use.

The composition according to the invention, such as a shielding, charge dissipation or corrosion protection material, can be applied to the metal substrate to be protected using any suitable technique, for example, spraying, brushing, immersion, flowing, etc. When the composition or material is used as a gasket or caulk, it is typically interfaced between the two surfaces to be sealed. The compositions or materials of the present invention can be formulated by admixing the binder and composite particle components, in the proportions as have been set forth hereinabove, using any suitable mixing techniques. The type and extent of drying or curing will vary in each case, depending on the specific nature of the binder used. For example, in some cases, heating can be utilized to effect drying or cure of the coating while in other cases, simple air drying or curing will be sufficient. In addition to exhibiting good shielding and dissipation characteristics the thus-formed conductive compositions are found to provide excellent corrosion protection for the metal substrates to which they are applied in cases where the compositions act as a sacrificial anode; in other embodiments, even though the compositions do not act as a sacrificial anode, they provide excellent EMI shielding or electrostatic charge dissipation while not contributing to galvanic corrosion.

As indicated heretofore, practice of the present invention results in the attainment of high conductivity and correspondingly low resistivity. Thus, with certain good embodiments of the invention a powder resistivity for the composite particles of 300 milliohm•cm or less, and an initial resistivity—when the composite particles are incorporated in a composition—of 300 milliohm•cm or less, are attainable. In order to conduct an evaluation of resistivity in corrosion testing the composition containing composite particles is suitably fashioned into a flanged gasket and then mounted on or proximate a base metal surface, so that the potential for the creation of a galvanic cell exists. In certain good embodiments of the invention, a gasket resistivity of 10 milliohm•cm or less is attainable after exposure for 3000 hours to salt spray.

The invention will be more fully described and understood with reference to the following examples which are given by way of illustration.

Figure 7:
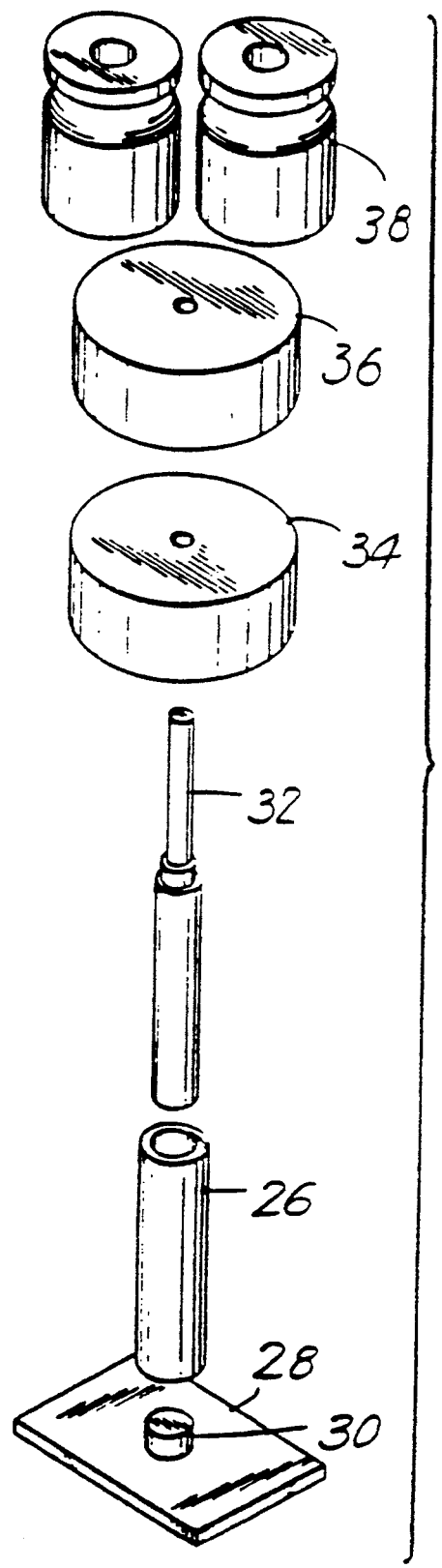
FIG. 7 depicts a device for measuring the powder resistivity of the composite particles according to the invention.

In the following examples, the volume resistivity for the composite particles according to the invention was measured and calculated in accordance with the following description and FIG. 7. Referring to FIG. 7, a precision glass tube 26 (bore tolerance±½ thousandth of an inch, ⅜" I.D.×⅞" O.D.×3" L, 0.25" wall thickness) is placed on a copper plate 28 (¼"×2"×3") having a nipple 30. One of the open ends of the glass tube 26 insertingly receives nipple 30. The powder sample to be measured is split with a one-to-one splitter on a piece of clean paper until a sample of approximately 5 grams is obtained. The 5 gram sample is then accurately weighed and placed into the glass tube using a small funnel. The copper plate with attached glass tube is then placed on a Syntrol Electric Vibrator Model FC-TO. A copper rod 32 (¼" D×5¼" L) is placed on the sample by inserting the copper rod into the glass tube 26. A one kilogram weight 34 is then placed on the copper rod, the range of the electric vibrator is set at 4.5 and the vibrator is then turned on for 60 seconds. The vibrator is then turned off and the height (cm) of the sample between the faces of the copper plate and the copper rod is measured with a ruler. Two clip-type probes (positive) are then attached to the top of the copper rod and two clip-type probes (negative) are attached to the contact on the copper plate. A resistance reading is then taken using a Hewlett Packard Milliohmeter Model 4328A. A second one kilogram weight 36 is then placed on top of the first one kilogram weight 34, the total weight is recorded as two kilograms and a second resistance reading is recorded. Two 1 lb. weights 38 are then placed on top of the two 1 kilogram weights, the total weight is recorded as 2.907 kilograms and a third resistance measurement is recorded. The height of the sample is again measured with a ruler as above.

The volume resistivity (P, ohms-cm) and the average volume resistivity are calculated as follows:

1. Calculate volume resistivity (ohms-cm) of the sample with the formula $$P = \frac{R \frac{d^2}{4} \pi}{L}$$

where:
P=resistivity (ohms-cm)
R=resistance (ohms)
d=inside diameter of glass tube (cm)
L=sample height (cm).

2. Average (mean) of the sample can be calculated as $$x = \frac{\text{sum of } X}{N}$$

where:
x=average (mean) of sample
X=sample value of volume resistivity
N=number of tests.

Also in the following examples, the silver content is calculated based on the weight of the core material.

EXAMPLE 1

The following is an example of the preparation of composite particles by ball milling. Aluminum spheres, in an amount of 75 g, size 75 microns, tungsten carbide particles, in an amount of 25 g, size 0.5 microns, and porcelain balls, in an amount of 500 g, size 0.5" in diameter, were charged into a ball mill jar. The ball mill jar was placed on a roller mill and the roller mill was activated so that the jar rotated at 75 RPM. After approximately one hour, the jar was removed from the roller mill and the contents of the jar were poured over a 20 mesh screen. The product from the screen was collected in a pan.

Composite particles of the invention were prepared in a similar manner using aluminum spheres upon which 2%, 4%, 6% or 8% silver had already been deposited. The resulting materials had the following volume resistivities:

| Conductive Particle | Volume Resistivity milliohm · cm |
| --- | --- |
| WC/Al | 390 |
| 2% Ag/WC/Al | 300 |
| 4% Ag/WC/Al | 280 |
| 6% Ag/WC/Al | 250 |
| 8% Ag/WC/Al | 33 |

EXAMPLE 2

To prepare an EMI shielding material, 22 grams of General Electric SE6035 silicone gum rubber were added to the head of a Brabender Plasticorder ™ equipped with cam blades. Mixing was initiated at 40 RPM after which 77 grams of WC/Al composite particles, or Ag/WC/Al composite particles according to the invention, were added. Mixing was continued for five minutes at 40 RPM after which time 2.8 grams of additional silicone gum rubber were added. Mixing was again continued for 10 minutes at 40 RPM, 0.5 grams of Lupersol 101 ™ was added and mixing continued for five minutes at 40 RPM until a homogenous paste was obtained. Mixing was discontinued, the homogenous paste was discharged from the Brabender mixing head, and then placed in a mold 4"×6"×0.075" until the mold was filled. The material was then compressed in the mold using a press heated to 175° C. and exerting a pressure of 400–1600 PSI. Constant temperature and pressure were maintained for 15 minutes after which the material was removed from the mold and allowed to cool. The cooled material was then placed in a convection oven for 15 minutes at 156° C. The resulting, rubberized material was die cut into a button having a thickness of 0.296 cm and a diameter of 2.261 cm. The button was placed in a screw-vise and resistivity measurements were taken at a pressure of 25 PSI. The results of these measurements were:

| Conductive Particle | Gasket Resistivity milliohm · cm |
| --- | --- |
| WC/Al | 4200 |
| 2% Ag/WC/Al | 1750 |
| 4% Ag/WC/Al | 276 |
| 6% Ag/WC/Al | 74 |
| 8% Ag/WC/Al | 33 |

EXAMPLE 3-5

In the following examples, the corrosion compatibility of electrically conductive compositions was determined using the Standard Method of Salt Spray (Fog) Testing, ASTM Designation: B117 (Flanged Gasket Test).

The salt spray test is an accelerated environmental corrosion test. The samples to be tested are mounted in a specially constructed chamber and subjected to a salt fog of 5% sodium chloride at 35° C. (95° F.) for a specific duration of time. The chamber of the salt fog apparatus is large enough so that the samples are subject to sufficient amounts of fog to ensure uniform exposure and corrosivity. Samples are inspected on a intermittent basis and subjectively rated as to degree of corrosion. Electrical resistivity measurements are performed during the inspection intervals to determine performance changes of the samples.

Each of the conductive powders to be tested was compounded into silicone rubber as previously described and molded into a thin sheet. A circular shape was die cut from the sheet and sandwiched between a pair of aluminum disks, three inches in diameter. The aluminum disks were bolted together with sufficient pressure to compress the rubber sample to 90% of its initial thickness and in such a manner that the bolts would not affect electrical resistivity measurements across the sandwich. Each of the sandwiches was placed in the chamber of the salt fog apparatus. Electrical resistivity measurements were made across the sandwich before and after exposure for varying amounts of time as indicated below. The results of the tests are as follows:

Example 3

| | Resistivities in Milliohm · cm for Flange Type 6061-T6 Al (Mil-G-83528) | | | | |
| --- | --- | --- | --- | --- | --- |
| Conductive Particle | 0 Hours | 144 Hours | 288 Hours | 432 Hours | 576 Hours |
| WC/Al | 155.00 | 600.00 | 910.00 | 740.00 | 855.00 |
| 4% Ag/Al | 1.33 | 18.00 | 62.00 | 168.00 | 1250.00 |
| 20% Ag/Al | 1.23 | 9.70 | 11.90 | 189.00 | 1453.00 |
| 4% Ag/WC/Al | 1.78 | 4.60 | 6.30 | 8.10 | 10.70 |

Example 4 Flange Type 6061-T6 Al (Mil-G-83528)

| Conductive Particle | Initial Resistivity Milliohm · cm | 500 Hour Resistivity Milliohm · cm | 1000 Hour Resistivity Milliohm · cm |
|---|---|---|---|
| WC/Al | 47.0 | 265.0 | 1170.0 |
| 2% Ag/WC/Al | 19.5 | 150.0 | 1010.0 |
| 4% Ag/WC/Al | 3.0 | 3.4 | 16.8 |
| 6% Ag/WC/Al | 1.6 | 3.3 | 725.0 |
| 8% Ag/WC/Al | 1.5 | 2.7 | 148.0 |

Example 5 (10 in.lb. torque applied to all flanges)

| Conductive Particle | Initial Resistivity Milliohm · cm | 500 Hour Resistivity Milliohm · cm | 1000 Hour Resistivity Milliohm · cm |
|---|---|---|---|
| WC/Al | 27.0 |  | 14.0 |
| 2% Ag/WC/Al | 26.0 |  | 357.0 |
| 4% Ag/WC/Al | 2.6 |  | 6.8 |
| 6% Ag/WC/Al | 1.8 |  | 6.0 |
| 8% Ag/WC/Al | 1.5 |  | 6.6 |
| 4% Ag/Al | 2.9 | 57.0 |  |
| 20% Ag/Al | 6.4 | 94.0 |  |
| 20% Ag/Cu | 1.3 | 13.0 |  |

EXAMPLE 6

As in Example 2, 22 g of General Electric SE 6035 silicone gum rubber were added to the head of a Brabender Plasticorder™ equipped with cam blades. Mixing was initiated at 40 RPM. A dispersant was, or was not, added dropwise for approximately 30 seconds as indicated in the following table. 77 g of WC/Al composite particles or 4% Ag/WC/Al composite particles according to the invention were added slowly over the next five to ten minutes. Mixing was continued for 5 minutes at 40 RPM after which time 2.8 grams of additional silicone gum rubber were added. Mixing was again continued for 10 minutes at 40 RPM at room temperature and the torque was read. Higher torque ratings indicate lower dispersibility of the composite particles. The final formulations contain about its weight percent filler in silicone gum rubber. The results appear below:

| Conductive Particle | Dispersant | % Dispersant | Torque m-g |
|---|---|---|---|
| WC/Al | None | None | 450 |
| WC/Al | Organo-titanate | 0.5 | 250 |
| WC/Al | Organo-titanate | 1.0 | 240 |
| 4% Ag/WC/Al | None | None | 150 |

LIST OF REFERENCES

1. Conductive Elastomer Gasket Design, *EMI Shielding Engineering Handbook*, Chomerics, Inc., Woburn, Mass., 25:25-26 (1985).
2. *CRC Handbook Of Chemistry And Physics*, 56th Edition (Weast, Ed.), D51-D58 (1975-1976).
3. T. Yokoyama, *Mechanofusion Treatment With Angmill And Its Potential In Industrial Application*, Product Literature from the Micromeritics Laboratory of Hosokowa Micron International, Inc., Summit, N.J.
4. M. Alonso, Mechanism Of The Combined Coating-Mechanofusion Processing Of Powders, *Powder Technology*, 59:45-52 (1989).
5. T. Yokoyama et al., The Angmill Mechanofusion System And Its Applications, *KONA*, No. 5, 59–68 (1987).
6. A New Method Of Agglomerating Heterogenous Powders, *Particle Fabrication*, Product Literature of Bepex Corporation, Minneapolis, Minn.
7. An Introduction To Powder Modification Technology, *Powder And Bulk Engineering*, 50–54 (February, 1990).
8. J. S. Benjamin, Mechanical Alloying, *Scientific American*, 234:40–48 (1976).
9. B. Fultz et al., Mechanical Alloying Of Fe And V Powders: Intermixing And Amorphous Phase Formation, *J. Mater. Res.*, 4(6):1450–1455 (1989).

What is claimed is:

1. A composite particle which is galvanically compatible with a metallis material, said particle comprising in combination:
   an electrically conductive core material having a surface oxide layer;
   an electrically conductive refractory material; and
   interposed between said electrically conductive refractory material and core material a noble metal or noble metal alloy;
   said core material and said refractory material being conductively fused.

2. A composite particle as defined in claim 1, wherein said noble metal or noble metal alloy is present in an amount of from 2–8 weight percent of the particle.

3. A composite particle as defined in claim 1, wherein the noble metal or noble metal alloy is present on the surface of the oxide-bearing core material as discrete formations.

4. A composite particle as defined in claim 1, which has a volume resistivity of 300 milliohm•cm or less.

5. A composite particle as defined in claim 1, which has a resistivity-conferring property such that the incorporation of an initial loading amount of said particles of 75 wt % of the composition confers upon that composition an initial resistivity of 300 milliohm•cm or less.

6. A composite particle as defined in claim 1, which has a resistivity-conferring property such that the incorporation of an initial loading amount of such particles of 75 wt % of the composition confers upon that composition a flanged gasket resistivity of 10 milliohm•cm or less after exposure for 3000 hours to salt spray.

7. A particle as defined in claim 1, configured such that the refractory material provides a conductive path through said oxide layer to said core material.

8. A composite particle according to claim 1, wherein said refractory material breaches said oxide layer and extends outwardly from said oxide layer.

9. A composite particle according to claim 8, wherein said refractory material comprises a plurality of particles, each of which particles breaches said oxide layer and extends outwardly from said oxide layer.

10. A composite particle according to claim 1, wherein said core material comprises a metal or metal alloy.

11. A composite particle according to claim 10, wherein said metal is aluminum, tin, zinc, nickel or magnesium.

12. A composite particle according to claim 1, wherein said refractory material is WC, NbB, NbB$_2$, TiN, VSi$_2$, MoB, TiB$_2$, ZrB$_2$, B$_4$C, ZrN, CoSi$_2$ or MoSi$_2$.

13. A composite particle according to claim 1, wherein said core material is Al, said noble metal is Ag and said refractory material is WC.

14. A composite particle according to claim 1, wherein said noble metal or noble metal alloy is present in an amount of from 2–8 weight percent, core material is present in an amount of about 10 to 97.5 weight percent and said refractory material is present in an amount of about 88 to 0.5 weight percent.

15. A composite particle according to claim 1, wherein the core has a particle size of average dimension about 0.5 to 200 microns, the oxide layer has a thickness of about 2 to 10,000 angstroms and the refractory material has a particle size of about 0.005 to 20 microns.

16. A composite particle according to claim 1, wherein the particles of the refractory material are of size ranging from about twice the thickness of the oxide layer to about one tenth the size of the core particle.

17. A composite particle according to claim 1, wherein said core material has a hardness of about 1 to 6 Mohs.

18. A composite particle according to claim 1, wherein said refractory material has a hardness greater than the hardness of the core material.

19. A composite particle, suitable for incorporation in an electrically conductive composition which is galvanically compatible in respect of a metallic material, said particle comprising in combination:
   a core material (a) being metallic and having a analysis substantially the same as that of said metallic material, or (b) being substantially electrochemically inert in respect of said metallic material, or (c) including a first portion having a metallic analysis substantially the same as that of said metallic material and a second portion which is substantially electrochemically inert in respect of said metallic material;
   an electrically conductive material, which electrically conductive material is substantially inert to participation in or catalysis of cathodic reaction involving the electrochemical reduction of molecular oxygen or water; and
   interposed between said electrically conductive material and said core material a noble metal or noble metal alloy;
   said electrically conductive material and said core being bonded through at least the noble metal or noble metal alloy.

20. A composite particle as defined in claim 19, wherein said noble metal or noble metal alloy is present in an amount of from 2–8 weight percent of the particle.

21. A composite particle as defined in claim 19, wherein the core material has a surface oxide formation and the noble metal or noble metal alloy is present on the surface of the oxide formation as discrete formations, said discrete formations each composed of a multiplicity of noble metal or noble metal alloy particles.

22. A composite particle as defined in claim 19, wherein said electrically conductive material is present in an amount sufficient to cover the core material so that, when a multiplicity of said composite particles is included in said composition, electrical contact between adjacent particles is not substantially impaired by formation of electrically insulating oxides on the core material.

23. A composite particle as defined in claim 19, wherein said core material is a metal which is aluminum.

24. A composite particle as defined in claim 19, wherein said core material is in particulate form and comprises a glass on which is deposited a metal or metal alloy.

25. A composite particle as defined in claim 19, wherein said electrically conductive material is a metal, metal alloy, metal carbide, metal sulfide, metal silicide, metal boride, metal nitride, or metal oxide.

26. A composite particle as defined in claim 25, wherein the electrically conductive material is a metal selected from the group consisting of aluminum, tin, zinc, nickel, cadmium, gold and indium.

27. A composite particle as defined in claim 25, wherein the electrically conductive material is a metal carbide selected from the group consisting of tungsten carbide, niobium carbide, titanium carbide, vanadium carbide, molybdenum carbide, zirconium carbide and boron carbide, a metal sulfide selected from the group consisting of copper sulfide, silver sulfide, iron sulfide, nickel sulfide, cobalt sulfide, lead sulfide and zinc sulfide, a metal silicide selected from the group consisting of chromium silicide, molybdenum silicide, cobalt silicide, vanadium silicide, tungsten silicide and titanium silicide, a metal boride selected from the group consisting of chromium boride, molybdenum boride, titanium boride, zirconium boride, miobium boride and tantalum boride, a metal nitride selected from the group consisting of tantalum nitride, titanium nitride, vanadium nitride and zirconium nitride, or a metal oxide selected from the group consisting of tin oxide, iron oxide, manganese oxide, copper oxide, lead oxide, ruthenium oxide, chromium oxide, silver oxide and antimony oxide.

28. A composite particle as defined in claim 19, wherein the electrically conductive material is bonded to said core material such that it forms a substantially continuous, or discontinuous, layer of thickness sufficient that the formation of any electrically insulating oxides on said core material does not, when a multiplicity of said particles is included in said composition, substantially impair electrical contact between adjacent composite particles.

29. A composite particle as defined in claim 19, which has a volume resistivity of 300 milliohm•cm or less.

30. A composite particle as defined in claim 19, which has a resistivity-conferring property such that the incorporation of an initial loading amount of such particles of 75 wt % of the composition confers upon that composition an initial resistivity of 300 milliohm•cm or less.

31. A composite particle as defined in claim 19, which has a resistivity-conferring property such that the incorporation of an initial loading amount of such particles of 75 wt % of the composition confers upon that composition a flanged gasket resistivity of 10 milliohm•cm or less after exposure for 3000 hours to salt spray.

32. A plurality of composite particles, each of said particles being as defined in claim 19.

* * * * *